United States Patent [19]
Hur et al.

[11] Patent Number: 6,141,279
[45] Date of Patent: Oct. 31, 2000

[54] REFRESH CONTROL CIRCUIT

[75] Inventors: Young-Do Hur; Ji-Bum Kim, both of Choongcheongbuk-Do, Rep. of Korea

[73] Assignee: Hyundai Electronics Industries Co., Ltd., Ichon-Shi, Rep. of Korea

[21] Appl. No.: 09/249,786

[22] Filed: Feb. 16, 1999

[30] Foreign Application Priority Data

Feb. 20, 1998 [KR] Rep. of Korea .......................... 98-5294

[51] Int. Cl.[7] ...................................................... G11C 7/00

[52] U.S. Cl. ............................................................ 365/222

[58] Field of Search .............................................. 365/222

[56] References Cited

U.S. PATENT DOCUMENTS

| 4,758,992 | 7/1988 | Taguchi | 365/222 |
|---|---|---|---|
| 5,347,491 | 9/1994 | Kagami | 365/222 |
| 5,365,487 | 11/1994 | Patel et al. | 365/226 |
| 5,999,481 | 12/1999 | Cowles et al. | 365/222 |

*Primary Examiner*—Amir Zarabian
*Assistant Examiner*—Vanthu Nguyen
*Attorney, Agent, or Firm*—Fleshner & Kim, LLP

[57] ABSTRACT

A refresh control circuit is provided that includes a control signal latency setting circuit that sets a control signal (CAS) latency, and a refresh mode setting that receives an output signal (REF) from the auto refresh mode decoder and an output signal (SREF) from the self-refresh mode decoder and outputs an output signal.

19 Claims, 10 Drawing Sheets

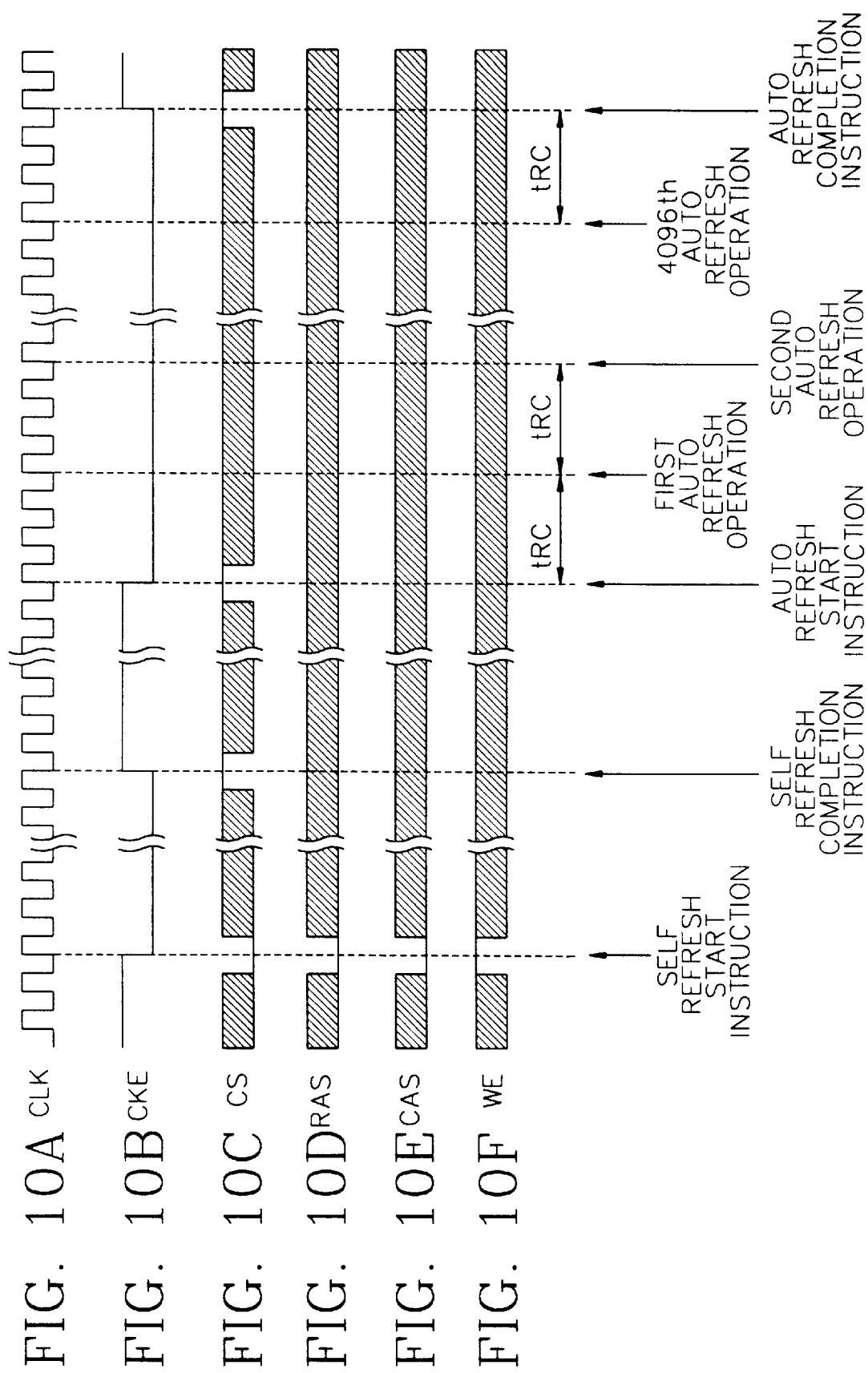

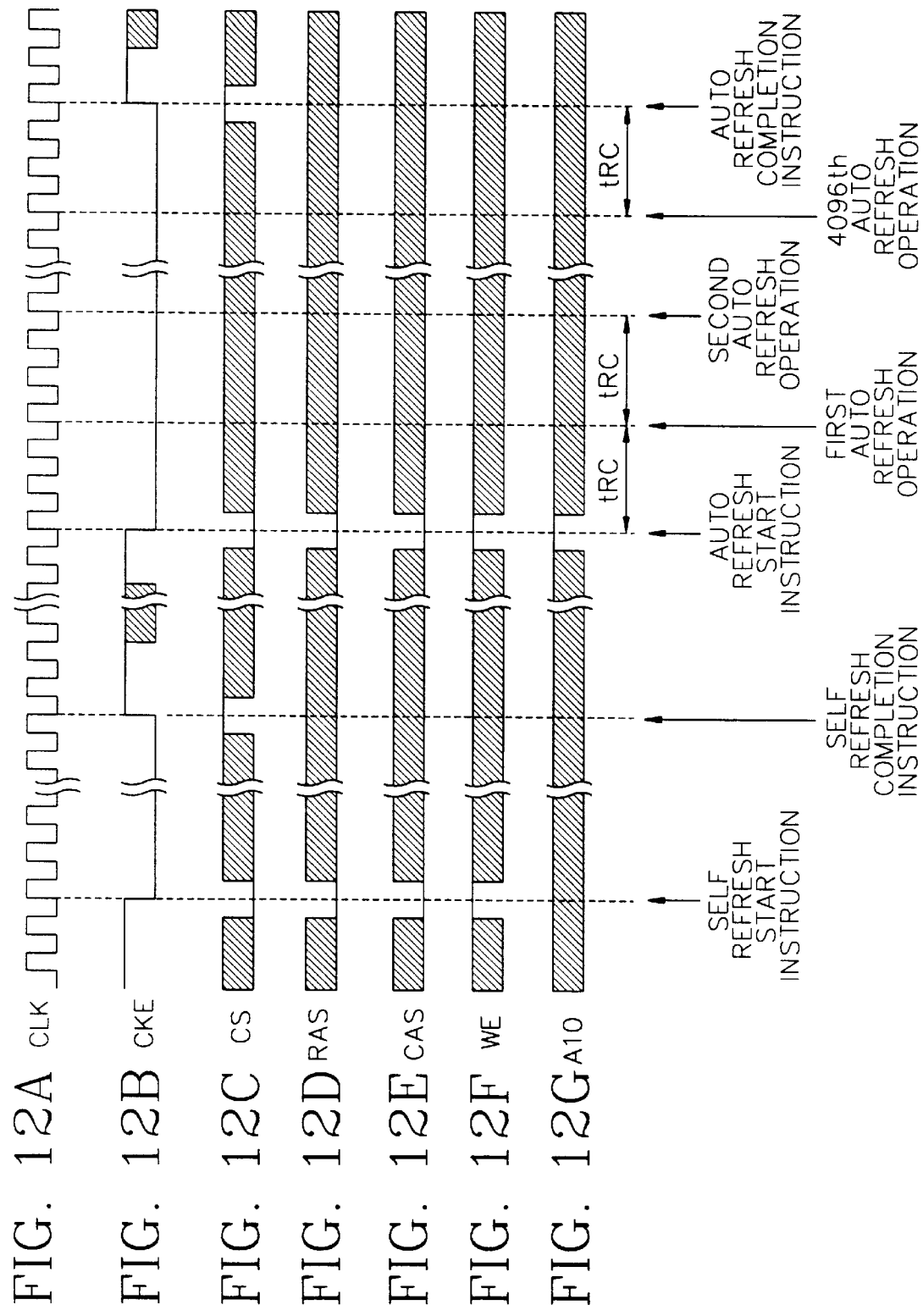

REFRESH CONTROL CIRCUIT

BACKGROUND OF THE INVENTION

1. Field of the Invention

The present invention relates to a refresh circuit, and in particular, to a refresh control circuit that decreases power consumption.

2. Background of the Related Art

As shown in FIG. 1, a related art refresh control circuit includes a row address input buffer 1 for receiving an external address ExADD, an auto refresh mode decoder 2 for interpreting an externally inputted instruction signal to implement an auto refresh operation and generate a sequential address increase flag signal REF, and a self-refresh mode decoder 3 for interpreting an externally inputted instruction signal to perform a self-refresh operation and generate a sequential address increase flag signal SREF. An auto refresh counter 4 generates all word line address signals in a memory cell array 7, which is an object of the refresh operation, in the auto refresh mode, and a self-refresh counter 5 generates all word line address signals in the memory cell array 7, which is the object of the refresh operation, based on a self timer in the self-refresh mode. A row decoder 6 decodes address signals from the auto refresh counter 4, the self-refresh counter 5 and the external address signals ExADD.

As shown in FIG. 2, the auto refresh mode decoder 2 includes inverters INV21 and INV22 for sequentially inverting an external clock signal CLK, an inverter INV23 for inverting an output signal of the inverter INV22 (i.e., the inverted signal of the external clock signal CLK) and a NOR-gate NOR21 for combining control signals CSB, RASB, CASB and WE. A D flip-flop DFF21 is controlled by the external clock signal CLK and an inverted signal of the external clock signal CLK. Further, an output signal from the NOR-gate NOR21 is applied to an input terminal of the D flip-flop DFF21. A NAND-gate ND21 NANDs an output signal from the D flip-flop DFF21 and the inverted signal of the external clock signal CLK received from the inverter INV22, and an inverter INV24 inverts an output signal from the NAND-gate ND21 and outputs the flag signal REF.

As shown in FIG. 3, the self-refresh mode decoder 3 includes a self-refresh completion circuit EX for receiving a control clock signal CKE and an inverted signal of a setting signal SET (i.e., SETB) and outputting a completion signal FSB, a self-refresh start circuit EN, and a RS flip-flop RSFF31. The self-refresh start circuit EN receives the external clock signal CLK, the control clock signal CKE and the control signals CSB, RASB, CASB and WE and outputs a start signal FRB. The RS flip-flop RSFF31 receives a completion signal FSB of the self-refresh completion circuit EX through an S-input terminal and the start signal FRB of the self-refresh start circuit EN through an R-input terminal and outputs the flag signal SREF to the self-refresh counter 5.

The self-refresh completion circuit EX includes a delay unit DE31 for delaying the control clock signal CKE, and a NOR-gate NOR31 for combining an output signal from the delay unit DE31 and the inverted signal SETB of the setting signal SET, which always has a low value when applying an electric power. The NOR-gate NOR31 outputs the output signal FSB.

The self-refresh start circuit EN includes inverters INV31 and INV32 for sequentially inverting the external clock signal CLK and a first D flip-flop DFF31 controlled by output signals from the inverters INV31 and INV32 to receive the control clock signal CKE through an input terminal. A second D flip-flop DFF32 receives an output signal from the first D flip-flop DFF31 through an input terminal and is controlled by the output signals of the inverters INV32 and INV31. A delay unit DE32 for delaying an internal clock signal ICK, which is an output signal from the second D flip-flop DFF32. Inverters INV33 and INV34 sequentially invert an output signal from the delay unit DE32, and a NOR-gate NO32 combines an internal clock signal ICK output by the second D flip-flop DFF32 and an output signal from the inverter INV34 to output an output clock signal CKD3.

Inverters EV35 and INV36 are for sequentially inverting the external clock signal CLK, an inverter INV37 is for inverting an inverted signal of the external clock signal CLK, and a NOR-gate NOR33 is for combining the external control signals CSB, RASB, CASB and WE. A D flip-flop DFF33 is controlled by the external clock signal CLK and the inverted signal of the same and has an input terminal that receives an output signal of the NOR-gate NOR33. A NAND-gate ND31 NANDs an output signal from the D flip-flop DFF33 and the external clock signal CLK, and an inverter INV38 inverts an output signal from the NAND-gate ND31. A delay unit DE33 is for delaying an output signal SAR from the inverter INV38. A NAND-gate ND32 is for NANDing an output signal CKD3 from the NOR-gate NOR32 and an output signal SARD from the delay unit DE33.

The operation of the related art auto refresh circuit will now be described. In the self-refresh mode, since an internal address signal by which a refresh operation is performed is generated by a internal chip timer in the self-refresh counter is generated to perform a refresh operation, it is not recognized as a word line address by which a refresh operation is performed by an external memory controller. Therefore, after the self-refresh operation is completed, an auto refresh operation is performed based on an external refresh instruction with respect to the entire address signals for an address signal, which is not refreshed during a self-refresh operation.

Namely, as shown in FIGS. 4A through 4F, after a self-refresh operation completion signal is inputted, an auto refresh operation is performed by control signals CS, RAS, CAS and WE as shown in FIGS. 4C through 4F generated by a memory driving controller for each word line in a corresponding refresh cycle. At this time, assuming that the number of word lines of the memory cell being auto-refreshed is 4096, 4096 auto refresh instructions are applied from the memory driving controller, and the chip internal address is sequentially increased by the auto refresh counter of the chip to perform an auto refresh operation.

Here, in the self-refresh mode, the self-refresh entry and exit are determined by the states of the refresh instructions CS, PAS, CAS and WE and the control clock signal CKE.

As described above, the related art memory chip has various disadvantages. In the related art refresh control circuit, in a 4K refresh chip for example, the interpretation operations are performed 4096 times by the instruction decoder with respect to the external control signals. Therefore, the consumption of the current is increased.

The above references are incorporated by reference herein where appropriate for appropriate teachings of additional or alternative details, features and/or technical background.

SUMMARY OF THE INVENTION

An object of the present invention is to provide a refresh control circuit that substantially overcomes one or more of the problems caused by limitations or disadvantages in the related art.

Another object of the present invention to provide a refresh control circuit that decreases power consumption.

Another object of the present invention to provide a refresh control circuit that removes a procedure for interpreting an external control signal.

Another object of the present invention to provide a refresh control circuit that decreases electric current consumption by removing a procedure for interpreting an external control signal to perform an auto refresh operation.

Another object of the present invention to provide a refresh control circuit that decreases electric current power consumption, which is used to interpret a control signal inputted for implementing an auto refresh operation, by automatically performing an auto refresh operation in a memory chip after a self-refresh operation is finished.

To achieve at least the above objects in a whole or in parts, there is provided a refresh control circuit that includes a control signal latency setting circuit to set latency for a control signal (CAS), and a refresh mode setting circuit that receives an output signal (REF) from the auto refresh mode decoder and an output signal (SREF) from the self-refresh mode decoder and outputs an output signal.

To further achieve at least the above objects in a whole or in parts, there is provided a refresh control circuit according to the present invention that includes a memory cell array, a row decoder unit coupled to the memory cell array that receives an address signal, and a refresh control circuit coupled to the row decoder unit, the refresh control circuit including, a refresh decoder unit that receives first and second instruction signals and generates first and second address increase signals, a refresh mode setting circuit that receives the first and second address increase signals from the refresh decoder unit and a latency control signal and outputs an output signal, and a refresh counter that receives first and second address increase signals and the output signal to generate first and second address signals, wherein the address signal is one of an external address signal and the first and second address signals.

To further achieve at least the above objects in a whole or in parts, there is provided a refresh control circuit according to the present invention that includes a refresh decoder unit that receives first and second instruction signals and generates first and second address increase signals, and a refresh mode setting circuit that receives the first and second address increase signals from the refresh decoder unit and a latency control signal and outputs a third address increase signal.

To further achieve at least the above objects in a whole or in parts, there is provided a refresh mode setting circuit according to the present invention that includes a self auto refresh mode decoder that receives a self refresh flag from the self-refresh mode decoder and a control clock signal and outputs a self-auto refresh signal, an auto refresh period detection circuit that receives the self-auto refresh signal from the self auto refresh mode decoder, latency setting signals and an auto refresh flag and outputs a second auto refresh flag, wherein the auto refresh period detection circuit includes an input unit that logically combines the self-auto refresh signal and a clock signal, a clearing unit that combines the self-auto refresh signal and a clearing control signal to generate a clear signal, a counter that receives an output signal from the input unit as an internal clock signal and is cleared by the clear signal, a combining unit that combines output signals of the counter, a clearing controller that receives output signals of the combining unit and the latency setting signals, and an output unit that receives the output signals from the combining unit and the self-auto refresh signal and outputs an intermediate address increase flag signal, a first logic circuit that logically processes the second auto refresh flag signal and the first auto refresh flag.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 10A through 10F are diagrams illustrating wave forms of operational timing of a refresh control circuit of FIG. 5;

FIGS. 12A through 12G are diagrams illustrating wave forms of operational timing of the self-refresh mode decoder of FIG. 11.

DETAILED DESCRIPTION OF PREFERRED EMBODIMENTS

Figure 1:
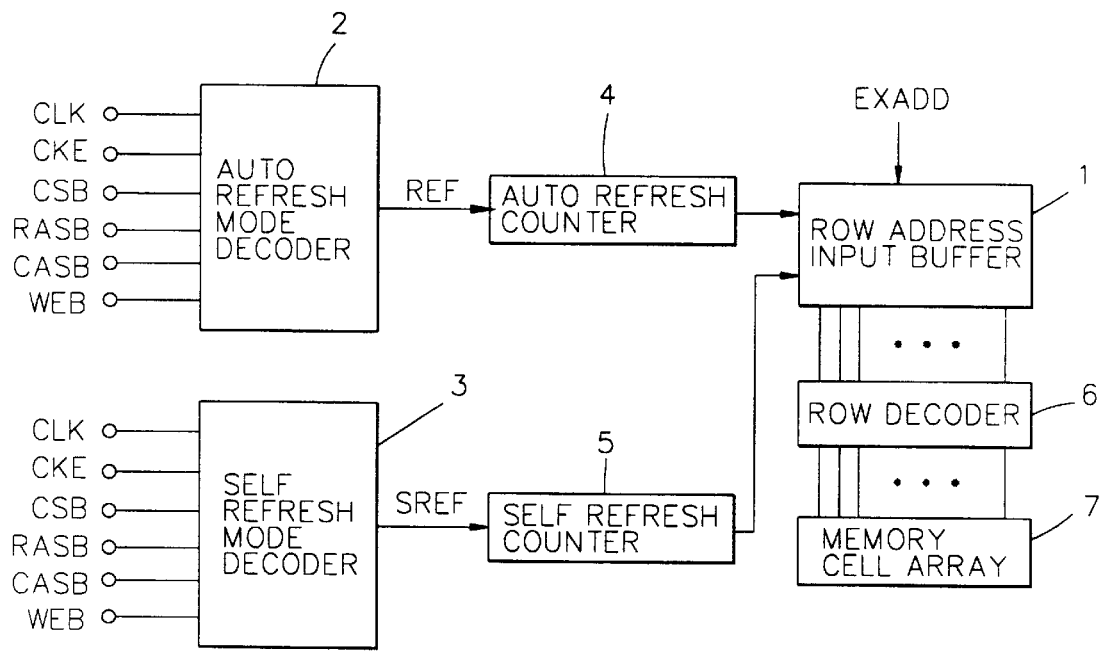
FIG. 1 is a block diagram illustrating a related art refresh control circuit.
Figure 2:
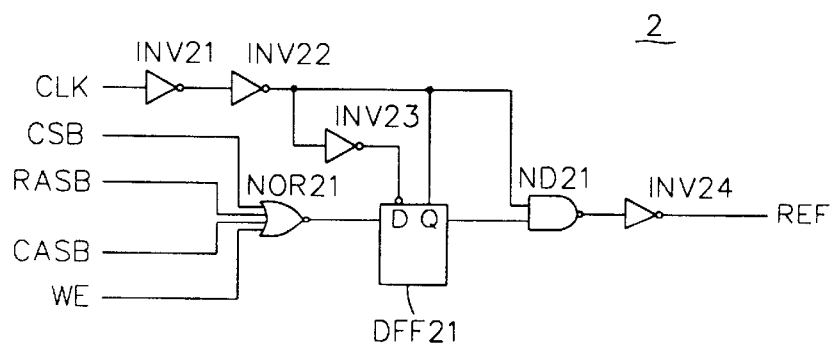
FIG. 2 is a circuit diagram illustrating an auto refresh mode decoder of FIG. 1.
Figure 3:
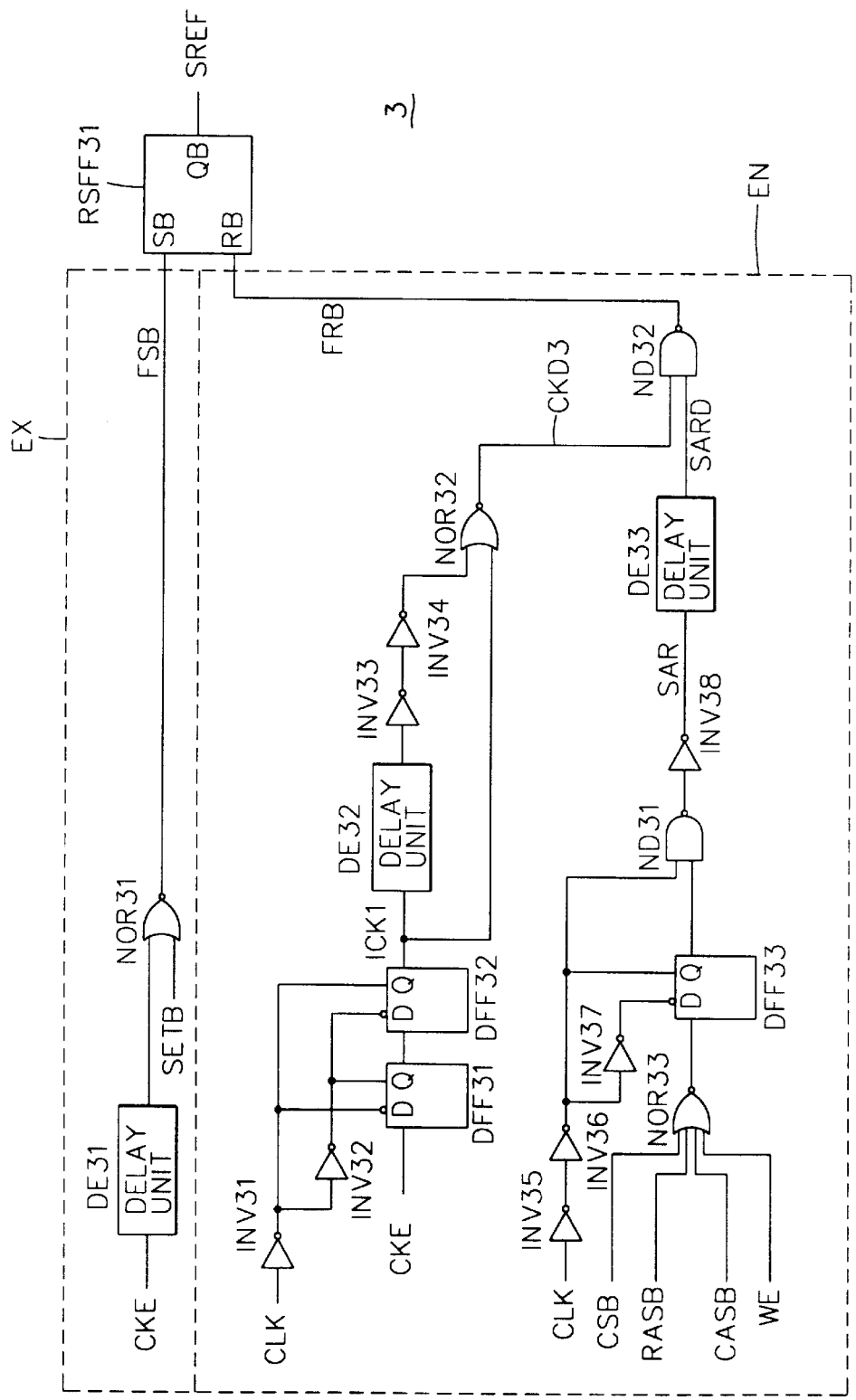
FIG. 3 is a circuit diagram illustrating a self-refresh mode decoder of FIG. 1.
Figure 4:
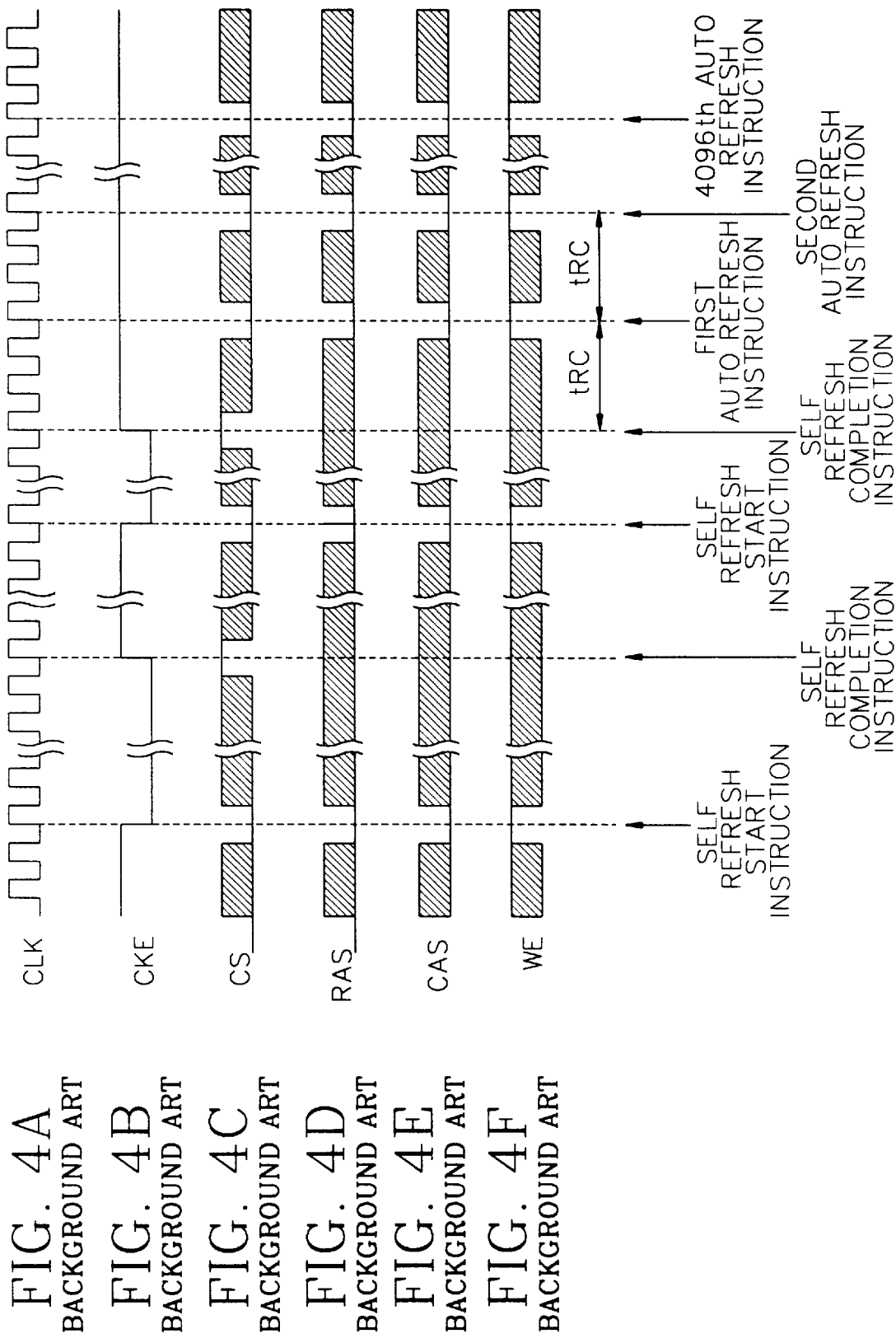
FIGS. 4A through 4F are diagrams illustrating timing wave forms of a related art refresh control circuit.
Figure 5:
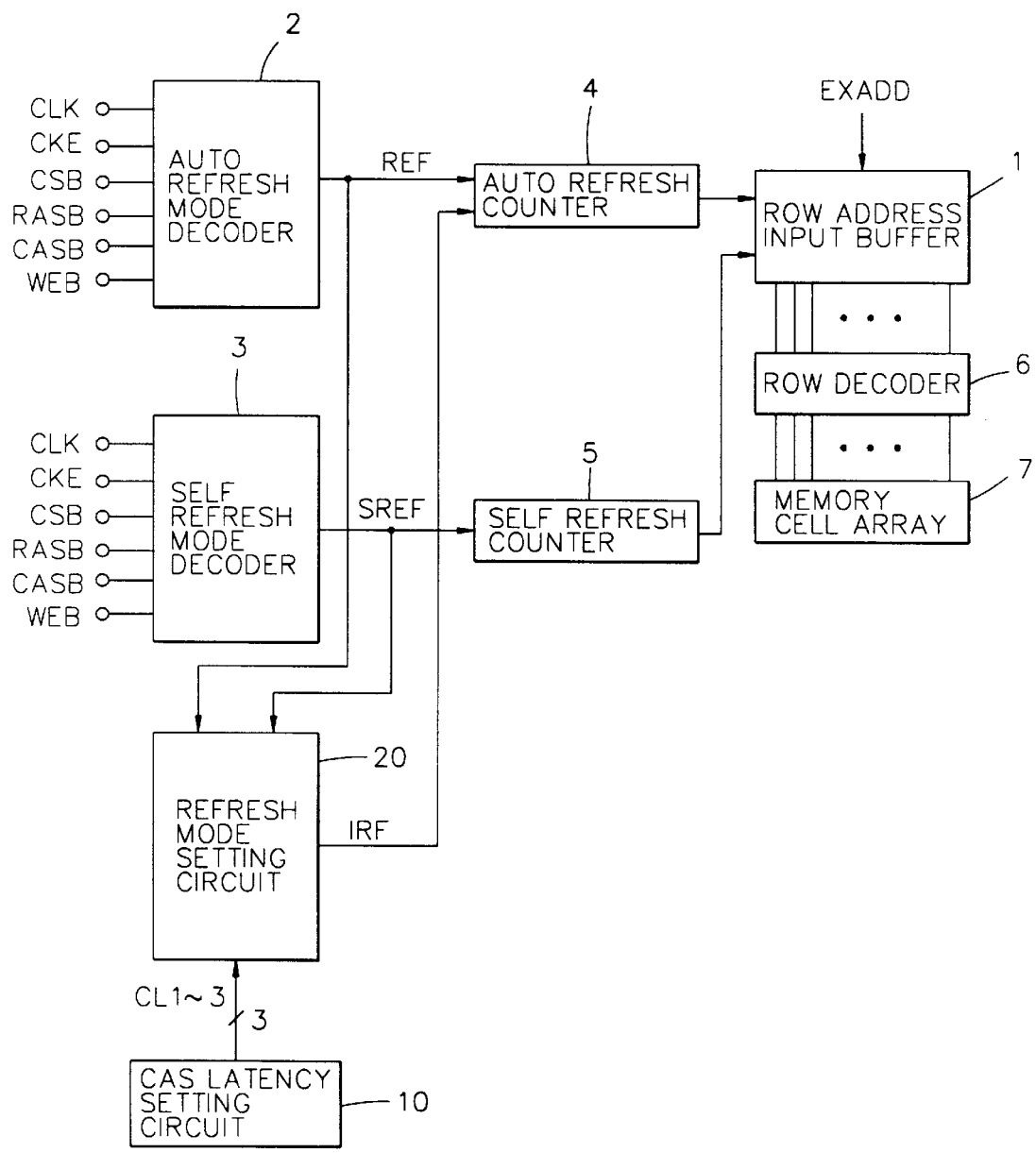
FIG. 5 is a block diagram illustrating a preferred embodiment of a refresh control circuit according to the present invention.

As shown in FIG. 5, a first preferred embodiment of a refresh control circuit according to the present invention includes a row address input buffer 1, an auto refresh mode decoder 2, a self-refresh mode decoder 3, a self-refresh counter 5, a row decoder 6 and a memory cell array 7 similar to the related art described above. The first preferred embodiment further includes a control signal latency setting circuit 10 that sets and outputs a latency of a control signal CAS and a refresh mode setting circuit 20 that receives an output signal REF from the auto refresh mode decoder 2 and an output signal SREF from the self-refresh mode decoder 3.

Figure 6:
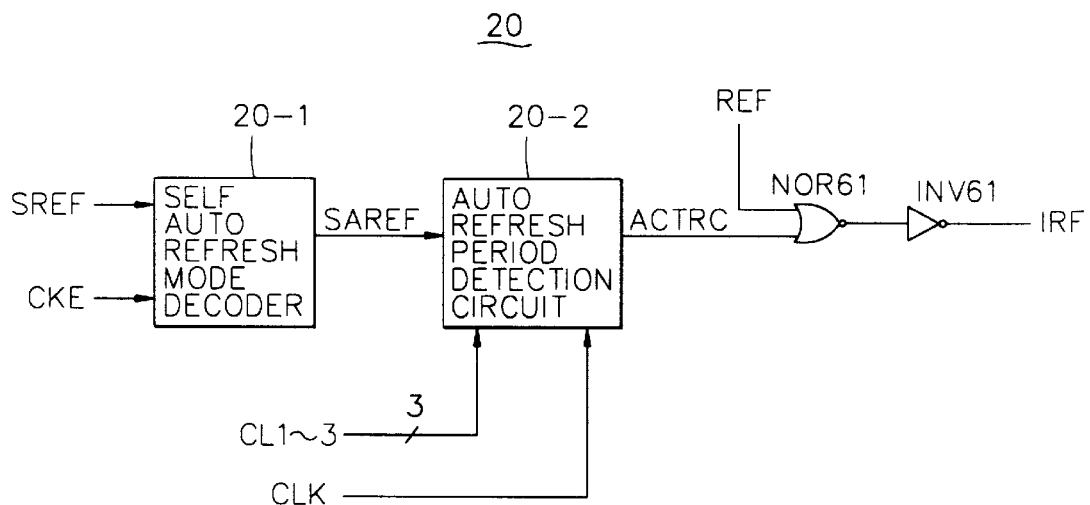
FIG. 6 is a circuit diagram illustrating a refresh mode setting circuit of FIG. 5.

As shown in FIG. 6, the refresh mode setting circuit 20 includes a self auto refresh mode decoder 20-1 for detecting an auto refresh mode after a self-refresh operation. An auto refresh period detection circuit 20-2 counts a number of clock signals to enable a one time refresh operation when an output signal SAREF from the self auto refresh mode decoder 20-1 and latency setting signals CL1 through CL3 from the control signal latency setting circuit 10 are inputted. The auto refresh period detection circuit 20-2 outputs an address increase flag signal ACTRC of the refresh counter. A NOR-gate NOR61 combines the signal ACTRC of the auto refresh period detection circuit 20-2 and the output signal REF from the auto refresh mode decoder 3. An inverter INV61 inverts an output signal from the NOR-gate NOR61 and outputs an output signal IRF.

Figure 7:
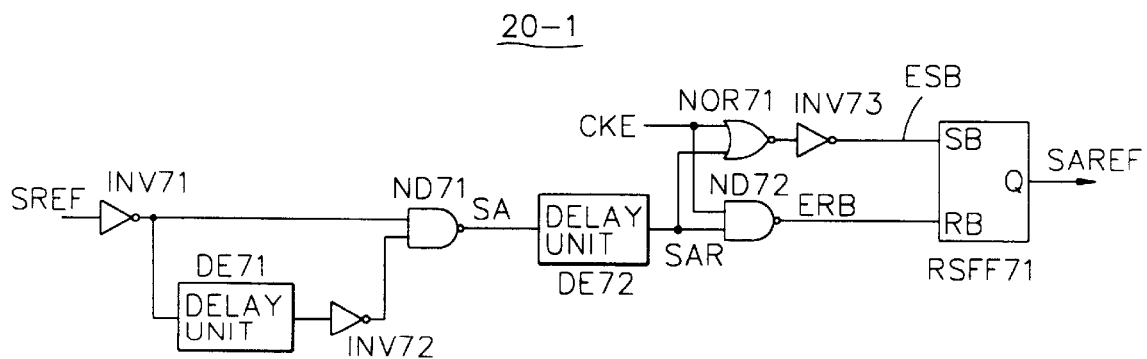
FIG. 7 is a circuit diagram illustrating a self-auto refresh mode decoder of FIG. 5.

As shown in FIG. 7, the self auto refresh mode decoder 20-1 includes a first inverter INV71 for inverting an output signal SREF from the self refresh mode decoder 3, a first delay unit DE71 for delaying an output signal from the first inverter INV71, a second inverter INV72 for inverting an output signal from the first delay unit DE71, and a first NAND-gate ND71 for NANDing an output signal from the second inverter INV72 and the output signal from the first inverter INV71. A second delay unit DE72 delays an output signal SA from the first NAND-gate ND71. A NOR-gate NOR71 and second NAND-gate ND72 combine an output signal SAR of the second delay unit DE72 and an external control signal CKE, and a third inverter INV73 inverts an output signal from the NOR-gate NOR71. A RS flip-flop RSFF71 has an S input terminal receiving an output signal ERB from the second NAND-gate ND72 and an R-input terminal receiving an output signal ESB from the third inverter INV73 and outputs the output signal SAREF.

Figure 8:
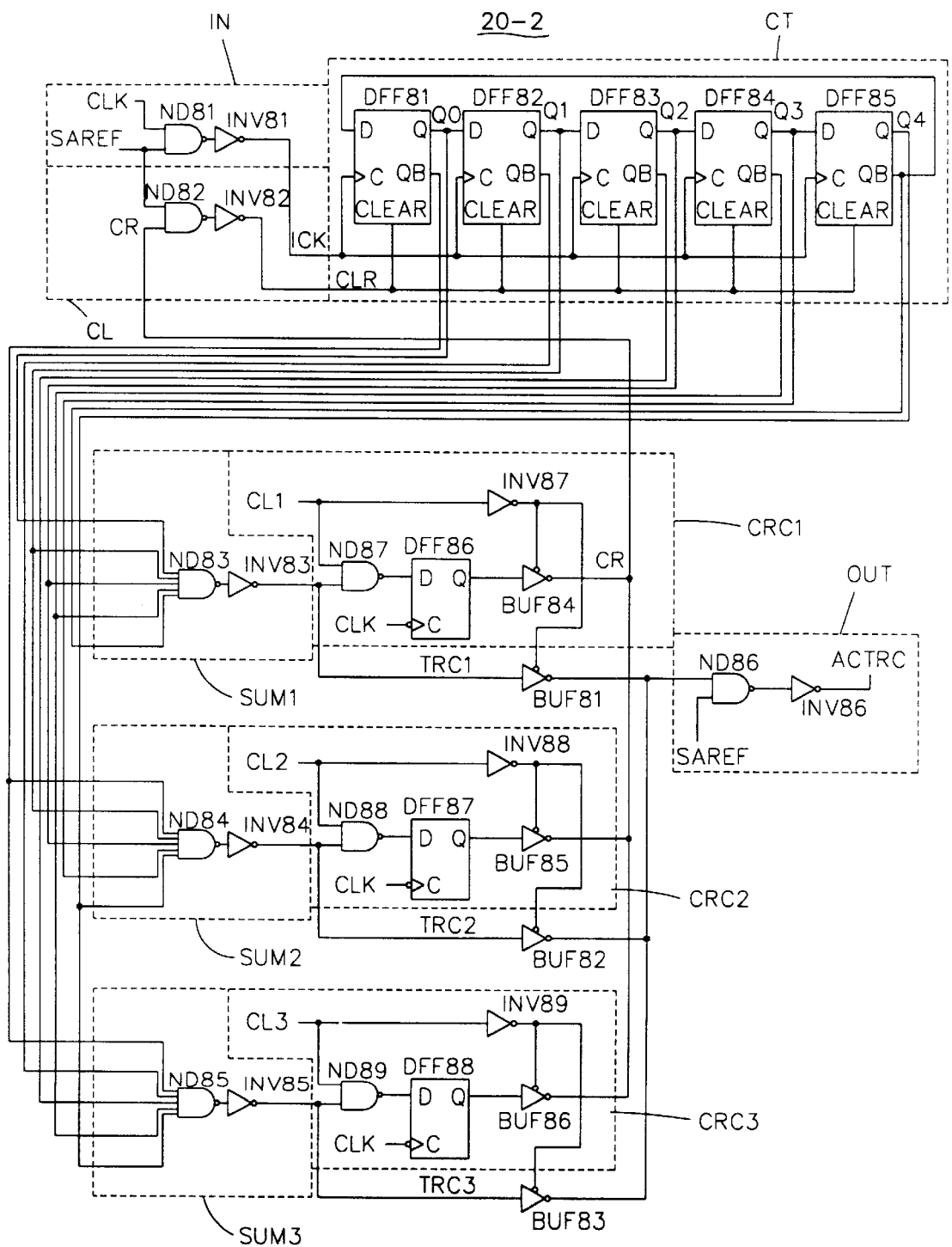
FIG. 8 is a circuit diagram illustrating an auto refresh period detection circuit of FIG. 5.

As shown in FIG. 8, the auto refresh period detection circuit 20-2 preferably includes an input unit IN having a first NAND-gate ND81 for NANDing the output signal SAREF from the self auto refresh mode decoder 20-1 and an external clock signal CLK and a first inverter INV81 for inverting an output signal from the first NAND-gate ND81 to output an internal clock signal ICK. A clearing unit CL outputs a clearing signal CLR by combining an output signal SAREF from the self auto refresh mode decoder 20-1 and a clearing control signal CR. A counter CT preferably having flip-flops DFF81 through DFF85 receives the internal clock signal ICK as a clock input signal and is cleared by the clearing signal CLR. Preferably summing units SUM1 through SUM3 sum the output signals Q0 through Q4 from the counter CT, and preferably clearing controllers CRC1 through CRC3 receive output signals TRC1 through TRC3 from the summing units SUM1 through SUM3 and latency setting signals CL1 through CL3 of the external control signal CAS and output the clearing control signal CR. Preferably buffers BUF81 through BUF83 are controlled by the inverted signal of the latency setting signals CL1 through CL3 of the external control signal CAS and selectively transmit output signals TRC1 through TRC3 from the summing units SUM1 through SUM3. Finally, an output unit OUT preferably includes a NAND-gate ND86 for NANDing output signals from the buffers BUF81 through BUF83 and the output signal SAREF from the self auto refresh mode decoder 20-1 and an inverter INV86 for inverting an output signal from the NAND-gate ND86 to output the address increase flag signal ACTRC.

The counter CT preferably includes D flip-flops DFF81 and DFF85, which are coupled in series, synchronized by the internal clock signal ICK and cleared by the clearing signal CLR. In the D flip-flops DFF81–DFF85, output signals from a previous unit are preferably applied to the next unit as input signals. The inverted output signal Q4B from the final D flip-flop DFF85 is fed back to the first D flip-flop DFF81 as an input signal.

The first summing unit SUM1 preferably includes a NAND-gate ND83 for NANDing the output signals Q0, Q1, Q2, Q3B and Q4B from the flip-flops DFF81 through DFF85 of the counter CT and an inverter INV83 for inverting an output signal from the NAND-gate ND83. Construction of the summing units SUM2 and SUM3 is preferably the same as the first summing unit SUM1. Among the output signals from the flip-flops DFF81 through DFF85 of the counter CT, the output signals Q0B, Q1, Q2, Q3 and Q4 correspond to the second summing unit SUM2, and the output signals Q0, Q1B, Q2B, Q3B and Q4 correspond to the third summing unit SUM3.

The first clearing controller CRC1 preferably includes a NAND-gate ND87 for NANDing an output signal TRC1 from the first summing unit SUM1 and a latency setting signal CL1 of the first control signal CAS, and a D-flip-flop DFFS6 for receiving an output signal from the NAND-gate ND87 and outputting a clearing control signal CR in synchronization with the external clock signal CLK. An inverter INV87 inverts a latency setting signal CL1 of the first control signal CAS, and an output buffer BUF84 is controlled by an inverted signal of the latency setting signal CL1 and selectively outputs an output signal from the D flip-flop DFF86. Construction of the remaining clearing controllers CRC2 and CRC3 is preferably the same as the first clearing controller CRC1.

Operations of the first preferred embodiment of the refresh control circuit according to the present invention will now be described. After the self-refresh operation is completed and the external control signal CKE is changed from a high level to a low level for implementing an internal auto refresh operation, the refresh operation is preferably performed based on a number of refresh cycles (for example, 4096 times in the case of 4K refresh chip) for an auto refresh period tRc.

As shown in FIG. 10B, the external control signal CKE is transited from a high level to a low level, and the self-refresh operation is started. Thereafter, the external control signal CKE is transited from a low level to a high level, and then the self-refresh operation is completed.

At this time, when a self auto refresh mode signal SAREF is a high level, the self auto refresh mode is started, and the internal auto refresh operation is performed. When the control signal CKE is transited from a low level to a high level, the self auto refresh mode is completed, and the auto refresh operation is completed. At this time, a time period from the self auto refresh mode start to the completion can be as much as the refresh cycle of the auto refresh period tRC.

When the self auto refresh signal SAREF is a high level, an internal clock signal ICK, which is obtained by combining the self auto refresh signal SAREF and an external clock signal CLK, is used as a main clock signal of the auto refresh period detection circuit 20-2.

When the self auto refresh mode is completed, namely, when the control signal CKE is transited from a low level to a high level, the self auto refresh signal SAREF is a low level, so that the auto refresh period detection circuit 20-2 is cleared, and the output signal ACTRC from the auto refresh period detection circuit 20-2 becomes a low level, so that the self auto refresh mode operation is completed.

Figure 9A:
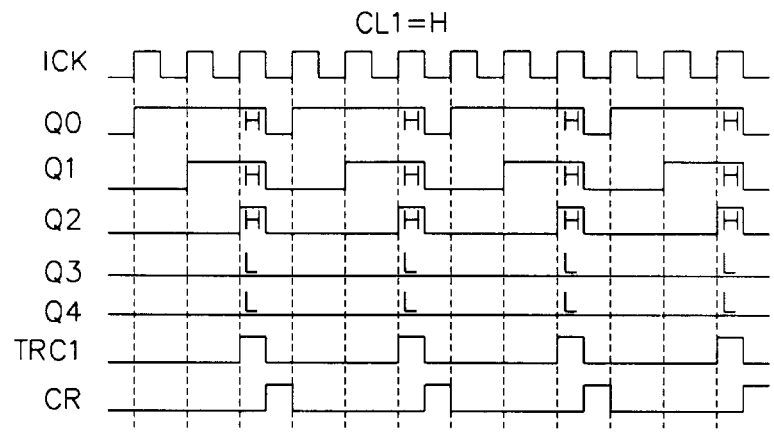
FIGS. 9A through 9C are diagrams illustrating wave forms of operational timing of an auto refresh period detection circuit based on a latency setting signal of a control signal CAS of FIG. 7.
Figure 9B:
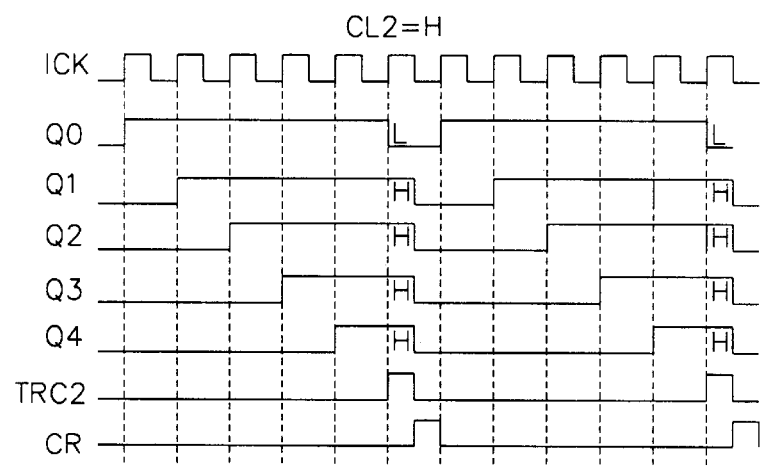
Figure 9C:
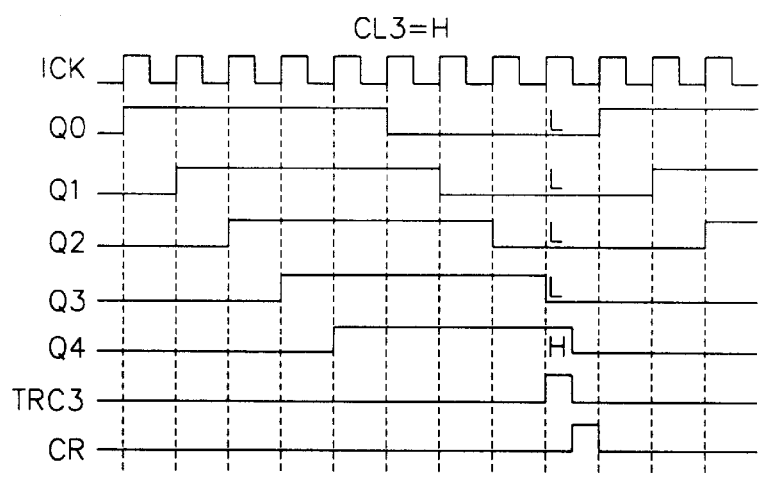

Since the number of counting of auto refresh period tRC is varied by a control signal CAS latency, the auto refresh period detection circuit 20-2 receives the control signal (CAS) latency setting signals CL1 through CL3 for detecting the number of clock signals, which can vary, corresponding to the auto refresh period tRC based on the control signal (CAS) latency. The auto refresh period detection circuit 20-2 detects that 9 internal clock signals ICK have passed at a third latency setting signal CL3 as shown in FIG. 9C, detects 6 clock signals have passed at a second latency setting signal CL2 as shown in FIG. 9B, detects a first latency setting signal CL1 as shown in FIG. 9A to generate the address increase flag signal ACTRC.

In a state of the control pins, if the control signals CS, RAS and CAS are low levels and the control signal WE is transited from a high level to a low level, the self auto refresh mode is preferably started, and the internal auto refresh operation is performed. In addition, as shown in FIGS. 10-C–10-F, if the control signal is low level, the control signals RAS, CAS and WE are high levels, or the control signal CS is a high level and the other control signals RAS, CAS and WE are in a don't care state, if the control clock signal CKE is transited from a low level to a high level, the self auto refresh mode is completed. Namely, when the control signal CKE is transited from a low level to a high level, since the control signal SAR becomes a low level and a self auto refresh signal SAREF becomes a low level, the latency detection circuit 20-2 is cleared, and the output signal ACTRC becomes a low level, so that the self auto refresh mode operation is completed.

Figure 11:
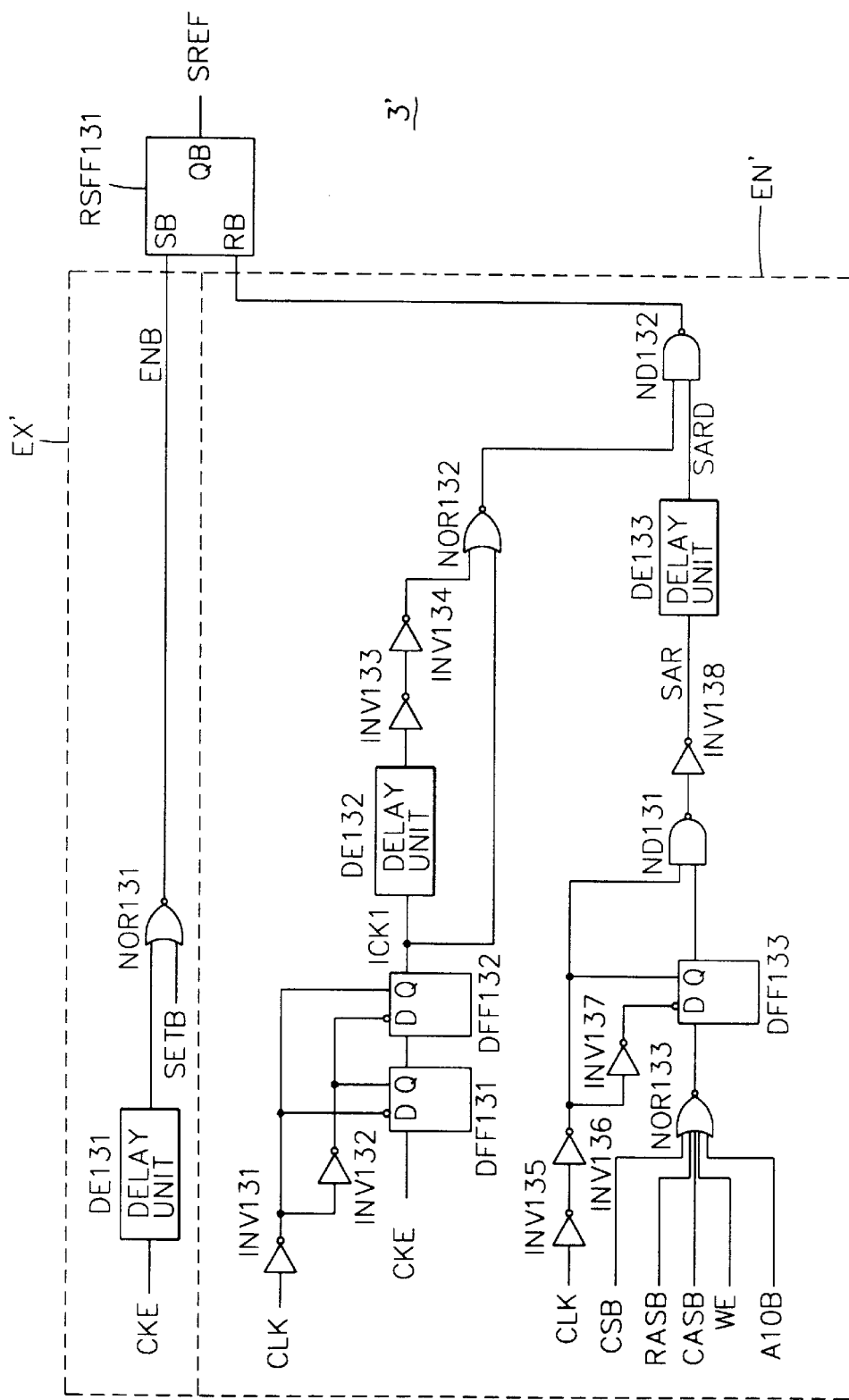
FIG. 11 is a circuit diagram illustrating a self-refresh mode decoder according to another preferred embodiment of the present invention.

A second preferred embodiment of a refresh control circuit according to the present invention will now be described. The construction of the second preferred embodiment is the same as the construction of a first preferred embodiment of the present invention, however, a self refresh mode decoder 3' is modified. As shown in FIG. 11, an address control signal A10 is inputted for controlling an auto refresh operation. Therefore, preferably when a control signal CKE is transited from a high level to a low level, the control signal SAR becomes a high level and the self auto refresh signal SAREF becomes a high level so that the auto refresh operation is started. When the self refresh operation is completed, the auto refresh operation is automatically performed.

When the self refresh signal SAREF is a high level, the internal clock signal ICK, which is obtained by combining a self auto refresh signal SAREF and an external clock signal CLK, is used as a main clock signal of the auto refresh period detection circuit 20-2.

As shown in FIGS. 12A–12G, when the control signal WE is a high level, the control signals CS, RAS and CAS are low levels, the address control signal A10 is a high level, and the state of the control clock signal CKE is transited from a high level to a low level, the self auto refresh mode is started, and then the internal auto refresh operation is performed. In addition, when the control signal CS is a low level and the other control signals RAS, CAS and WE are high levels, or in a state that the control signal CS is a high level and the other control signals RAS, CAS and WE are in the don't care state, when the state of the control signal CKE is transited from a low level to a high level, the self auto refresh mode is completed.

As described above, the preferred embodiments of a refresh control circuit according to the present invention, have various advantages. According to the preferred embodiments of a refresh control circuit, it is possible to decrease the consumption of an electric power by decreasing the electric current when interpreting an external control signal by automatically performing an auto refresh operation after the self-refresh operation is completed.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A memory device, comprising:
    a memory cell array;
    a row decoder unit coupled to the memory cell array that receives an address signal; and
    a refresh control circuit coupled to the row decoder unit, the refresh control circuit comprising,
        a refresh decoder unit that receives first and second instruction signals and generates first and second address increase signals,
        a refresh mode setting circuit that receives the first and second address increase signals from the refresh decoder unit and a latency control signal and outputs an output signal, and
        a refresh counter that receives first and second address increase signals and the output signal to generate first and second address signals, wherein the address signal is one of an external address signal and the first and second address signals.

2. The memory device of claim 1, wherein the refresh control circuit further comprises a latency control signal setting circuit that sets the latency control signal.

3. The memory device of claim 1, wherein the refresh decoder unit comprises:
    an auto refresh mode decoder that receives the first instruction signal and generates the first address increase signal; and
    a self-refresh mode decoder that receives the second instruction signal and generates the second address increase signal, and wherein the refresh counter comprises,
        an auto-refresh counter that receives the first address increase signal and the output signal for sequentially accessing all wordlines of the memory array in an auto-refresh mode, and
        a self-refresh counter that receives the second address increase signal to generate address signals of corresponding word lines included in the refresh operation using a timer in a self-refresh mode.

4. The memory device of claim 3, wherein the row decoder unit includes a row address buffer unit that receives the external address signal and a row decoder connected between the row address buffer unit and the memory array, and wherein the first and second instruction signals are an auto-refresh instruction and a self-refresh instruction.

5. The memory device of claim 1, wherein the refresh control circuit decreases power consumption of the memory device by automatically performing an auto refresh operation after a self-refresh operation is completed based on the output signal of the refresh mode setting circuit.

6. A refresh control circuit, comprising,
    a refresh decoder unit that receives first and second instruction signals and generates first and second address increase signals; and
    a refresh mode setting circuit that receives the first and second address increase signals from the refresh decoder unit and a latency control signal and outputs a third address increase signal.

7. The circuit of claim 6, wherein the refresh control circuit further comprises a refresh counter that receives first, second and third address increase signals to generate self refresh and auto refresh control signals.

8. The circuit of claim 7, wherein the refresh mode setting circuit includes:
- a self auto refresh mode decoder that receives the second address increase signal and a control clock signal and sets an auto refresh interval;
- an auto refresh period detection circuit that receives an output signal from the self auto refresh mode decoder and the latency control signal and detects a period of the auto refresh;
- a first logic circuit that logically processes an output signal from the auto refresh period detection circuit and the first address increase signal and outputs the third address increase signal.

9. The circuit of claim 8, wherein said self auto refresh mode decoder includes:
- a first logic gate that logically processes the second address increase signal;
- a first delay unit that delays an output signal from the first logic gate;
- a second logic gate that logically processes an output signal from the first delay unit;
- a third logic gate that logically processes output signals from the first and second logic gates;
- a second delay unit that delays an output signal from the third logic gate;
- fourth and fifth logic gates that respectively logically combine an output signal from the second delay unit and the control clock signal;
- a sixth logic gate that logically processes an output signal from the fourth logic gate; and
- a flip-flop having a first input terminal that receives an output signal from the fifth logic gate and a second input terminal that receives an output signal from the sixth logic gate.

10. The circuit of claim 9, wherein the first, second and sixth logic gates are inverters, the third and fifth logic gates are NAND gates, the fourth logic gate is a NOR gate and the flip-flop is an RS flip-flop.

11. The circuit of claim 8, wherein the auto refresh period detection circuit includes:
- an input unit that logically combines an output signal from the self auto refresh mode decoder and an external clock signal;
- a clearing unit that combines the output signal from the self auto refresh mode decoder and a clearing control signal to generate a clear signal;
- a counter that receives an output signal from the input unit as an internal clock signal and is cleared by the clear signal;
- a combining unit that combines output signals of the counter;
- a clearing controller that receives output signals of the combining unit and latency setting signals of the latency control signal; and
- an output unit that receives the output signals from the combining unit and the output signal from the self auto refresh mode decoder and outputs the output signal of the auto refresh period detection circuit.

12. The circuit of claim 11, wherein the input unit includes:
- a NAND-gate that NANDs the output signal from the self auto refresh mode decoder and the external clock signal; and
- an inverter that inverts an output signal from the NAND-gate to output the internal clock signal.

13. The circuit of claim 11, wherein the clearing unit includes:
- a NAND-gate that NANDs the output signal from the self auto refresh mode decoder and the clearing control signal; and
- an inverter that inverts an output signal from the NAND-gate and outputs the clear signal.

14. The circuit of claim 11, wherein the counter includes:
- a plurality of flip-flops synchronized by the internal clock signal and cleared by the clear signal, wherein an output signal of a previous flip-flop is applied to a data input terminal of the next flip-flop of the plurality of flip flops, and wherein an inverted output signal from the final flip-flop of the plurality of flip-flops is fed back to the data input terminal of the first flip-flop.

15. The circuit of claim 11, wherein the combining unit comprises a plurality of combining elements, wherein each combining element includes:
- a NAND-gate that NANDs selected output signals of the counter; and
- an inverter that inverts an output signal from the NAND-gate.

16. The circuit of claim 15, wherein the selected output signals for said each combining element is determined in accordance with the latency setting signals.

17. The circuit of claim 11, wherein the clearing controller comprises a plurality of clearing controller elements, wherein each clearing controller element comprises:
- a NAND-gate that NANDs a corresponding output signal from the combining unit and a corresponding latency setting signal of the latency control signal;
- a D flip-flop that receives an output signal from the NAND-gate and outputs in synchronization with the external clock signal;
- an inverter that receives the corresponding latency setting signal; and
- an output buffer controlled by the inverted corresponding latency setting signal to selectively output an output signal from the D flip-flop as the clearing control signal.

18. The circuit of claim 11, wherein the output unit includes:
- a plurality of buffers controlled based on the latency setting signals to selectably output one of the output signals of the combining unit;
- a NAND-gate that NANDs the output signal of the combining unit and the output signal of the self auto refresh mode decoder; and
- an inverter that inverts an output signal from the NAND-gate and outputs the third address increase signal.

19. A refresh mode setting circuit, comprising:
- a self auto refresh mode decoder that receives a self refresh flag from a self-refresh mode decoder and a control clock signal and outputs a self-auto refresh signal;

an auto refresh period detection circuit that receives the self-auto refresh signal from the self auto refresh mode decoder and latency setting signals to output a second auto refresh flag, wherein the auto refresh period detection circuit comprises,
    an input unit that logically combines the self-auto refresh signal and a clock signal,
    a clearing unit that combines the self-auto refresh signal and a clearing control signal to generate a clear signal,
    a counter that receives an output signal from the input unit as an internal clock signal and is cleared by the clear signal,
    a combining unit that combines output signals of the counter,
    a clearing controller that receives output signals of the combining unit and the latency setting signals, and
    an output unit that receives the output signals from the combining unit and the self-auto refresh signal and outputs an intermediate address increase flag signal; and
a first logic circuit that logically processes the second auto refresh flag signal and a first auto refresh flag.

* * * * *